(12) United States Patent
Zimmermann et al.

(10) Patent No.: US 9,690,203 B2
(45) Date of Patent: Jun. 27, 2017

(54) METHOD FOR ADJUSTING AN ILLUMINATION SETTING

(71) Applicant: Carl Zeiss SMT GmbH, Oberkochen (DE)

(72) Inventors: Joerg Zimmermann, Aalen (DE); Ralf Stuetzle, Aalen (DE); Paul Graeupner, Aalen (DE); Olaf Conradi, Westhausen/Westerhofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 206 days.

(21) Appl. No.: 14/590,210

(22) Filed: Jan. 6, 2015

(65) Prior Publication Data

US 2015/0153652 A1    Jun. 4, 2015

Related U.S. Application Data

(63) Continuation of application No. PCT/EP2013/064963, filed on Jul. 16, 2013.

(30) Foreign Application Priority Data

Jul. 19, 2012    (DE) .................. 10 2012 212 664

(51) Int. Cl.
  *G03F 7/20*    (2006.01)
  *G02B 26/08*    (2006.01)

(52) U.S. Cl.
  CPC ..... *G03F 7/70141* (2013.01); *G02B 26/0833* (2013.01); *G03F 7/702* (2013.01); *G03F 7/70075* (2013.01); *G03F 7/70116* (2013.01); *G03F 7/70191* (2013.01)

(58) Field of Classification Search
  None
  See application file for complete search history.

(56) References Cited

U.S. PATENT DOCUMENTS

| 6,195,201 | B1 | 2/2001 | Koch et al. |
| 6,452,661 | B1 | 9/2002 | Komatsuda |
| 2002/0136351 | A1 | 9/2002 | Singer |
| 2003/0038225 | A1* | 2/2003 | Mulder ............... G03F 7/70116 250/205 |

(Continued)

FOREIGN PATENT DOCUMENTS

| DE | 100 53 587 A1 | 5/2002 |
| DE | 10 2009 045 491 A1 | 11/2010 |

(Continued)

OTHER PUBLICATIONS

German Office Action, with translation thereof, for corresponding DE Appl No. 10 2012 212 664.3, dated Feb. 20, 2013.

(Continued)

*Primary Examiner* — Steven H Whitesell Gordon
(74) *Attorney, Agent, or Firm* — Fish & Richardson P.C.

(57) ABSTRACT

Method for setting an illumination setting in an illumination optical unit comprising at least one controllable correction device, which includes a multiplicity of adjustable correction elements for influencing the transmission, wherein the illumination setting is varied for adapting a predetermined imaging parameter in the region of an image field.

20 Claims, 12 Drawing Sheets

(56) References Cited

U.S. PATENT DOCUMENTS

Figure 1:
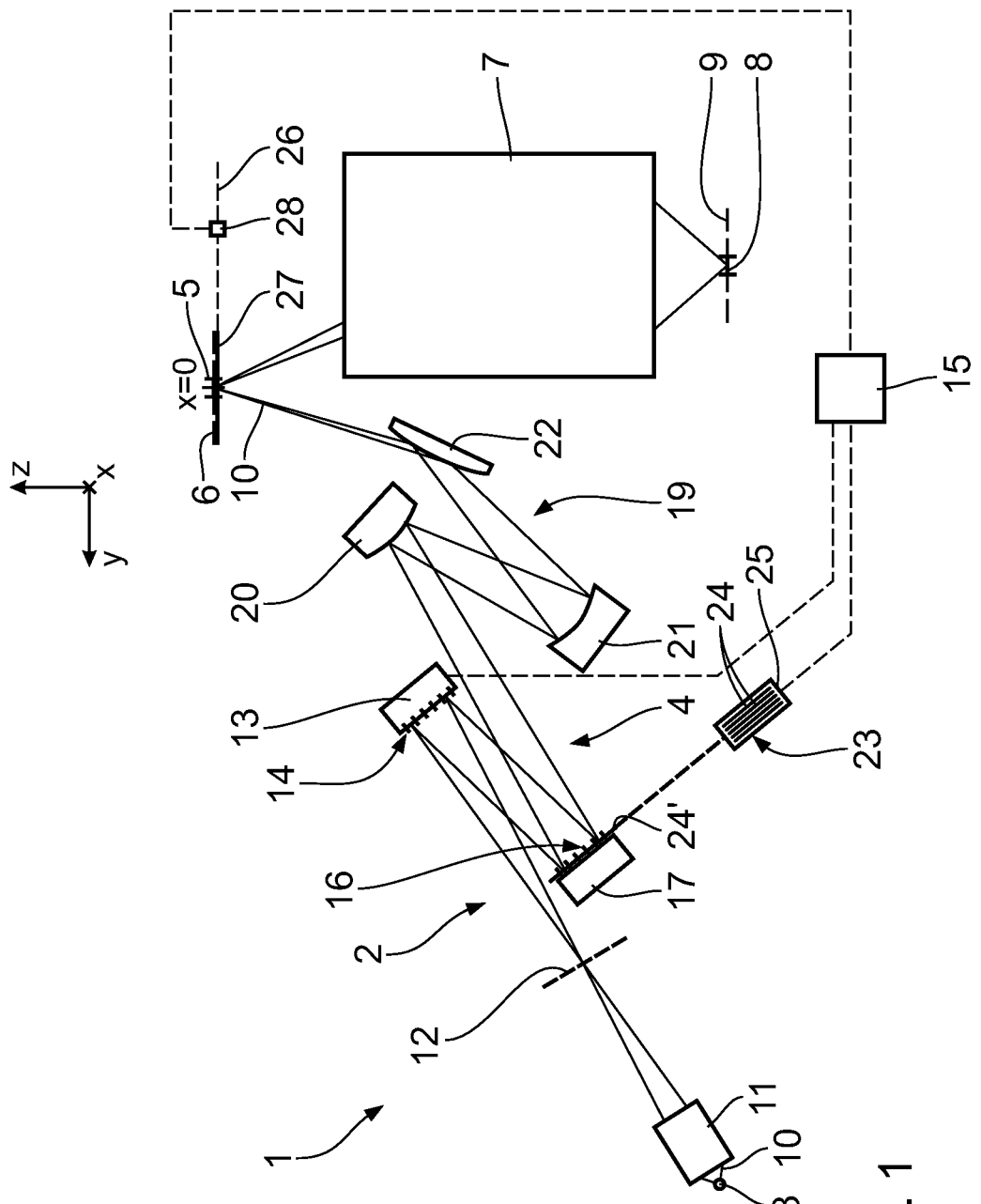

| | | | |
|---|---|---|---|
| 2003/0227603 A1* | 12/2003 | Dierichs | G03F 7/70091 355/47 |
| 2008/0013680 A1 | 1/2008 | Singer et al. | |
| 2008/0088814 A1* | 4/2008 | Kajiyama | G03F 7/70075 355/71 |
| 2008/0165925 A1 | 7/2008 | Singer et al. | |
| 2008/0212059 A1* | 9/2008 | Warm | G03F 7/70083 355/68 |
| 2008/0278704 A1* | 11/2008 | Endres | G03F 7/70108 355/67 |
| 2009/0251677 A1* | 10/2009 | Endres | G02B 27/0905 355/71 |
| 2010/0253926 A1* | 10/2010 | Endres | G03F 7/70075 355/67 |
| 2011/0001947 A1 | 1/2011 | Dinger et al. | |
| 2011/0063598 A1* | 3/2011 | Fiolka | G03F 7/70083 355/71 |
| 2011/0122392 A1* | 5/2011 | Fiolka | G03F 7/70075 355/71 |
| 2011/0235015 A1* | 9/2011 | Dengel | G03F 7/70141 355/71 |
| 2011/0242544 A1* | 10/2011 | Stroessner | G03F 1/84 356/496 |
| 2012/0242968 A1 | 9/2012 | Layh et al. | |

FOREIGN PATENT DOCUMENTS

| | | |
|---|---|---|
| DE | 10 2011 005 881 A1 | 5/2012 |
| EP | 1 225 481 A | 7/2002 |
| EP | 1 349 009 A2 | 10/2003 |
| WO | WO 2009/100856 | 8/2009 |
| WO | WO 2011/076500 A1 | 6/2011 |

OTHER PUBLICATIONS

International Search Report for corresponding PCT Appl No. PCT/EP2013/064963, dated Nov. 27, 2013.

* cited by examiner

METHOD FOR ADJUSTING AN ILLUMINATION SETTING

CROSS-REFERENCE TO RELATED APPLICATIONS

The present application is a continuation of, and claims benefit under 35 USC 120 to, international application PCT/EP2013/064963, filed Jul. 16, 2013, which claims benefit under 35 USC 119 of German Application No. 10 2012 212 664.3, filed Jul. 19, 2012. The contents of the international application PCT/EP2013/064963 and German application 10 2012 212 664.3 are incorporated herein by reference.

The invention relates to a method for setting an illumination setting. The invention furthermore relates to an illumination optical unit for performing such a method, an illumination system and a projection exposure apparatus comprising such an illumination optical unit. Moreover, the invention relates to a method for producing a microstructured or nanostructured component.

Projection exposure apparatuses for microlithography are known from e.g. EP 1 349 009 A2. Ultimately, the imaging properties or imaging variables in the region of the image field to be exposed, i.e. on the wafer, are decisive for the quality of a lithography system.

It is an object of the invention to specify a method for setting an illumination setting, via which the quality of an illumination optical unit, and hence of a projection exposure apparatus comprising a corresponding illumination optical unit, is improved.

This object is achieved by a method for setting an illumination setting, comprising the following steps:
  providing an illumination optical unit for forming a predeterminable illumination setting for illuminating a reticle arranged in an object field and intended to be imaged in an image field, comprising:
    a first facet mirror comprising a multiplicity of individual mirrors,
    a second facet mirror comprising a multiplicity of individual mirrors,
      wherein the second facet mirror is disposed downstream of the first facet mirror in the beam path of the illumination optical unit, and
      wherein at least a subset of the individual mirrors of the first facet mirror is uniquely assignable to a subset of the individual mirrors of the second facet mirror for forming illumination channels of the illumination setting, and
    at least one mechanism for varying the illumination setting,
      wherein the at least one mechanism for varying the illumination setting comprises at least one controllable correction device which includes a multiplicity of adjustable correction elements for influencing the transmission,
  predetermining an initial illumination setting comprising an initial transmission and an initial illumination pupil,
  predetermining at least one imaging variable to be set in the region of the image field,
  predetermining a target value for the at least one imaging variable,
  determining an actual value for the at least one imaging variable,
  varying the illumination setting until the actual value corresponds to the target value within predetermined tolerances.

The core of the invention consists of adapting the illumination setting for illuminating a reticle arranged in an object field and intended to be imaged in an image field in such a way that a predetermined imaging variable is set, more particularly optimized, in the region of the image field. According to the invention, what was identified is that an illumination setting can be optimized not only in view of pupil dimensions or properties of the illumination of an object field, but also in view of imaging variables in the region of the image field. This can be brought about, firstly, via suitable correction elements for influencing the transmission and, secondly, by varying the illumination channels formed. Here, an illumination setting is understood to mean not only the setting of a specific intensity distribution in a pupil plane, but, in general, the setting of a specific intensity and angle-of-incidence distribution in the object field.

By way of example, filters or stops can serve as correction elements. In particular, provision can be made for arranging a correction device, comprising at least a correction stop and/or a correction filter, adjacent to a pupil facet mirror in the beam path of the illumination optical unit. In particular, the filter and/or the stop may be interchangeable. A predetermined selection of pupil facets may be attenuated or stopped down via the filter or the stop.

As an alternative or in addition to such a correction device assigned to the illumination pupil, it is possible to influence the transmission in a correction plane, which is arranged in, or adjacent to, a field plane, in particular arranged adjacent to the object field. Such a correction device, which is also referred to as a UNICOM or field intensity correction element, is known from e.g. DE 10 2011 005 881 A1, which is hereby referred to.

According to one aspect of the invention, at least one of the correction elements of the at least one correction device can be adjusted for varying the illumination setting. A correction of the intensity, in particular of the angle of incidence-dependent intensity, can be achieved in a particularly simple manner via the correction elements.

According to a further aspect of the invention, at least one of the individual mirrors of the first facet mirror can be adjusted for varying the illumination setting. In particular, the first facet mirror can be a field facet mirror. It is arranged in a plane that is optically conjugate to the object field. The individual mirrors can in each case be individual field facets, in particular macroscopic field facets, of the field facet mirror. In particular, the field facets are adjustable. For further details of a field facet mirror with adjustable field facets, reference is made to e.g. WO 2011/076 500 A1. In particular, the field facets can be swivelable. By swivelling the field facets it is possible to influence the assignment of same in relation to the pupil facets. As a result, radiation channels can be individually switched over or switched off in a targeted manner. In order to vary the illumination setting, at least one of the individual mirrors of the first facet mirror can also be stopped down. This should likewise be understood to mean an adjustment of the corresponding individual mirror or mirrors.

The field facet mirror can also be embodied as a microelectromechanical system (MEMS) comprising a multiplicity of adjustable individual mirrors, in particular micromirrors. In this case, a field facet can comprise a multiplicity of individual mirrors. For further details, reference is made to e.g. WO 2009/100 856 A1. As a result of such an embodiment of the field facet mirror, the variability of the illumination optical unit, in particular the adjustability of the illumination setting, is further increased.

In accordance with a further aspect of the invention, provision is made for a test structure arranged in the object field to be imaged into the image field in order to determine the actual value of the at least one imaging variable. A structure of the reticle layout used for producing a structured component may also serve as a test structure. In particular, the test structure is imaged on a wafer via a projection optical unit in order to expose a light-sensitive layer on the wafer. Subsequently, the actual value of the imaging variable to be set can be measured on the wafer.

In accordance with a further aspect of the invention, provision is made for a simulation method in order to determine the actual value. This enables a particularly efficient optimization of the illumination setting.

In accordance with an advantageous embodiment, it is also possible to combine the determination of the actual value via a simulation method and the actual measurement of an actual value on an exposed wafer. In particular, the simulation method can be used to make a preselection of different illumination settings from which the best is then selected using actual measurements.

In accordance with a further aspect of the invention, the at least one imaging variable to be set is selected from the following variables: variation of a critical dimension (CD) due to field variations, projection aberrations or system variations, difference in the critical dimension of horizontal and vertical structures (H–V difference), difference in the critical dimension of isolated and dense structures (iso-dense bias) and imaging telecentricity. In particular, the imaging variable to be set can be a structure image dimension variation, in particular the variation of a critical dimension (ΔCD).

In accordance with a further aspect of the invention, at least one boundary condition which is satisfied during the variation of the illumination setting is predetermined. This firstly restricts the available parameter space and therefore simplifies the optimization, and secondly this can ensure that the illumination setting has specific characteristics.

By way of example, a possible predeterminable boundary condition is that the varied illumination setting has a minimum transmission value of 90%, in particular 95%, in particular 99% of the transmission value of the original illumination setting, i.e. the start or initial illumination setting. In other words, this makes it possible to ensure that the variation does not lead to large transmission losses.

It is also possible to predetermine, as a boundary condition, that at most 10%, in particular at most 5%, in particular at most 1% of the illumination channels are varied. In particular, it is possible to predetermine that at most 10%, in particular at most 5%, in particular at most 1% of the illumination channels are switched off. An illumination channel can be switched off both via an appropriate stop and by suitable swivelling of the corresponding field facet.

It is also possible to predetermine that at most 10%, in particular at most 5%, in particular at most 1% of the field facets are repositioned, in particular swivelled.

The complexity of the optimization method can be reduced by restricting the maximum number of illumination channels to be varied.

It is also possible to predetermine, as a boundary condition, that the varied illumination setting has an illumination pupil which deviates by at most a predetermined value from the initial illumination pupil. If the pupil shape is described in a cylindrical pupil coordinate system having a radius a, normalized to 1, it is possible, in particular, to predetermine as a boundary condition that at most 5% of the spots, in particular at most 1% of the spots, in particular no spots at all lie outside a region defined by σ=0.9. Here, a spot refers to the image of an illumination channel in the pupil plane. Accordingly, it is possible to predetermine, as a boundary condition, that at most 5% of the spots, in particular at most 1% of the spots, in particular no spots at all lie within a region defined by σ=0.5. In other words, it is possible to predetermine that the varied illumination pupil lies in an annular region. It is also possible to select σ=0.95 or any other value as the upper limit for the outer edge. It is also possible to select σ=0.4 or σ=0.6 or any other value as the lower limit of the inner edge.

Proceeding from an initial illumination setting with an initial illumination pupil with a maximum σ value ($\sigma_{max}$) and a minimum σ value ($\sigma_{min}$), it is also possible to predetermine, as a boundary condition, that at most 5% of the spots, in particular at most 1% of the spots, in particular no spots at all lie in a region of the pupil with a σ value which is 0.2 times larger than $\sigma_{max}$ or 0.2 times smaller than $\sigma_{min}$. Here, the allowed region can also be narrower by virtue of the maximum deviation being set to 0.1, in particular 0.05.

In accordance with one aspect of the invention, provision is made for the varying of the illumination setting to be performed according to an iterative, discrete linear optimization method.

Further objects of the invention consist of improving an illumination optical unit and an illumination system for a projection exposure apparatus and a projection exposure apparatus. These objects are achieved by such subject matter as disclosed herein.

The advantages of the illumination optical unit and the projection exposure apparatus comprising such an illumination optical unit emerge from the advantages of the method for setting the illumination setting.

A further object of the invention consists of improving a method for producing a microstructured or nanostructured component. This object is achieved by such methods as disclosed herein. The advantages emerge from those of the method for setting an illumination setting. In particular, it is possible to produce components comprising structures with a smaller critical dimension. In particular, this increases the integration density.

Figure 2:
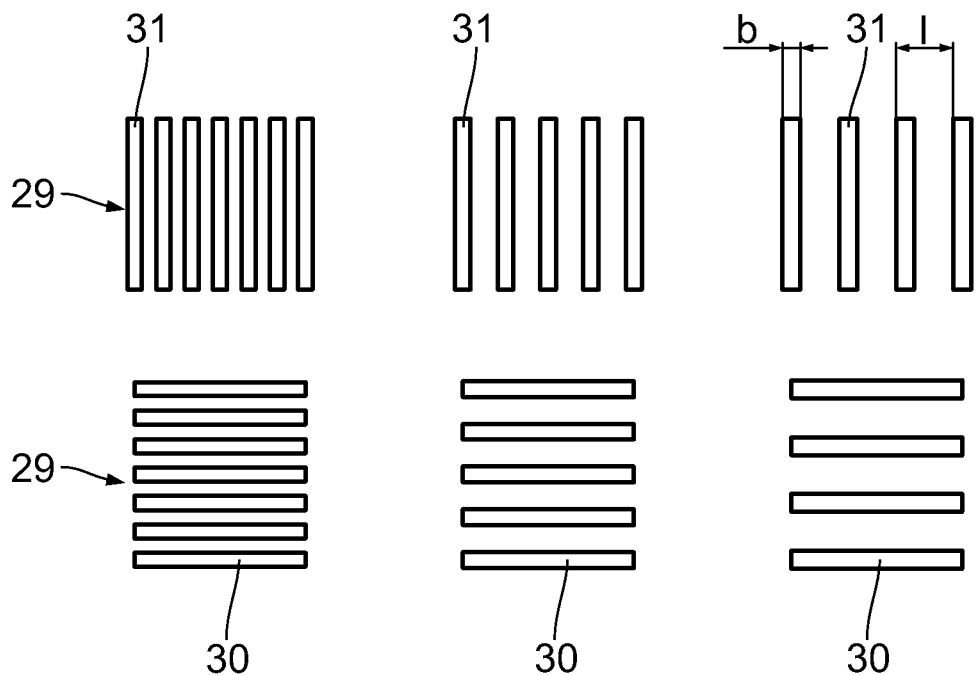
Figure 3:
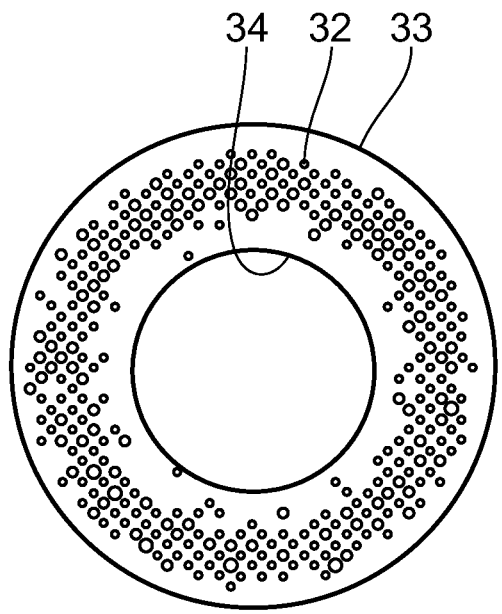
Figure 4:
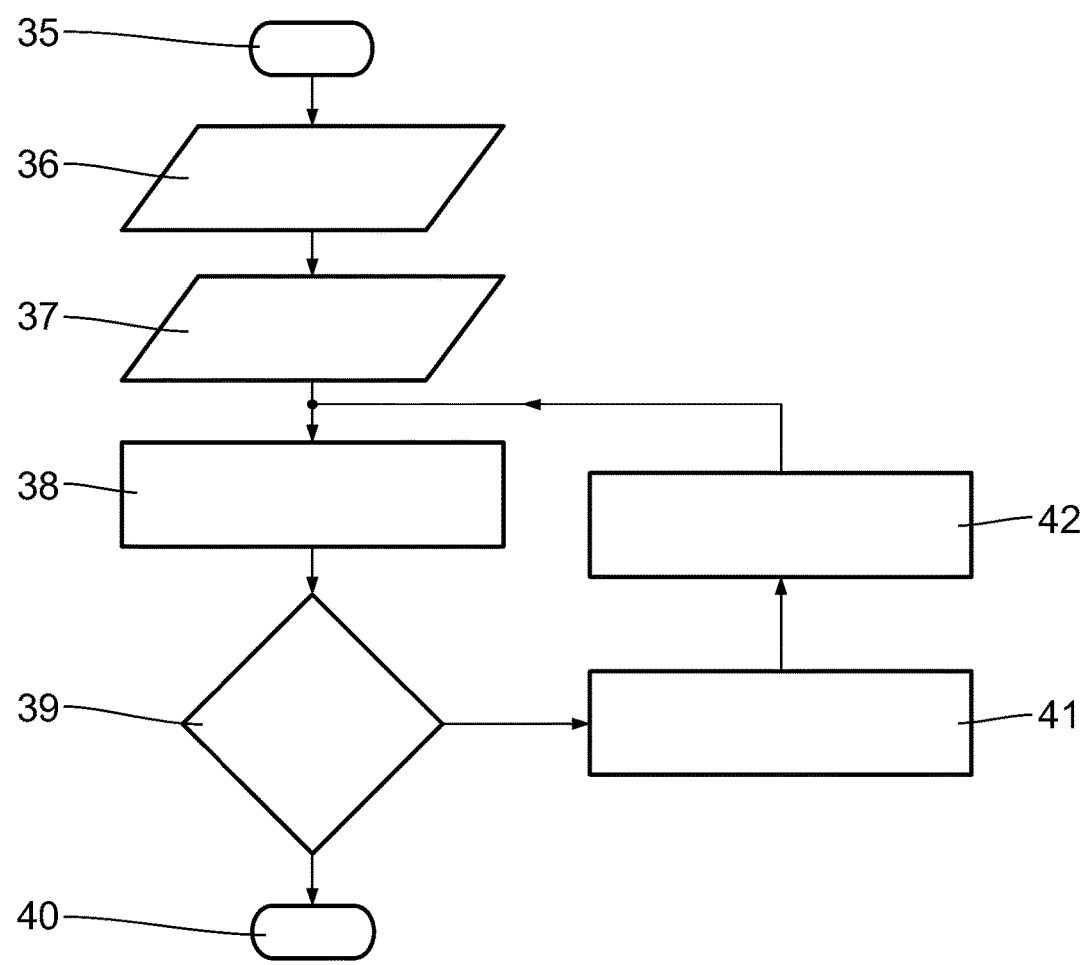
Figure 5A:
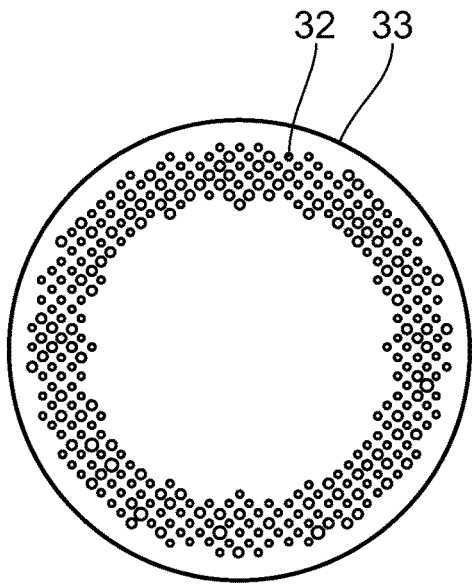
Figure 5B:
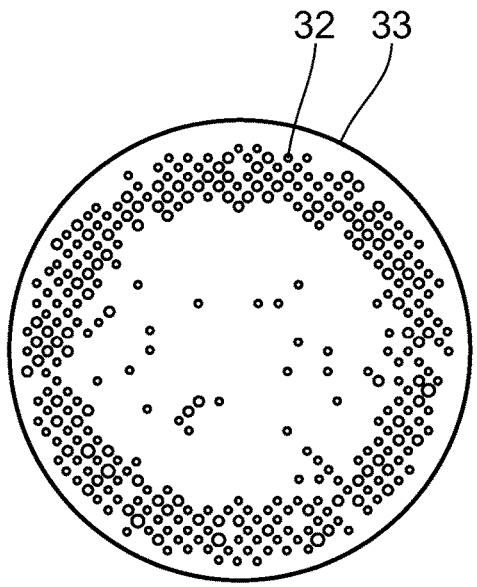
Figure 6:
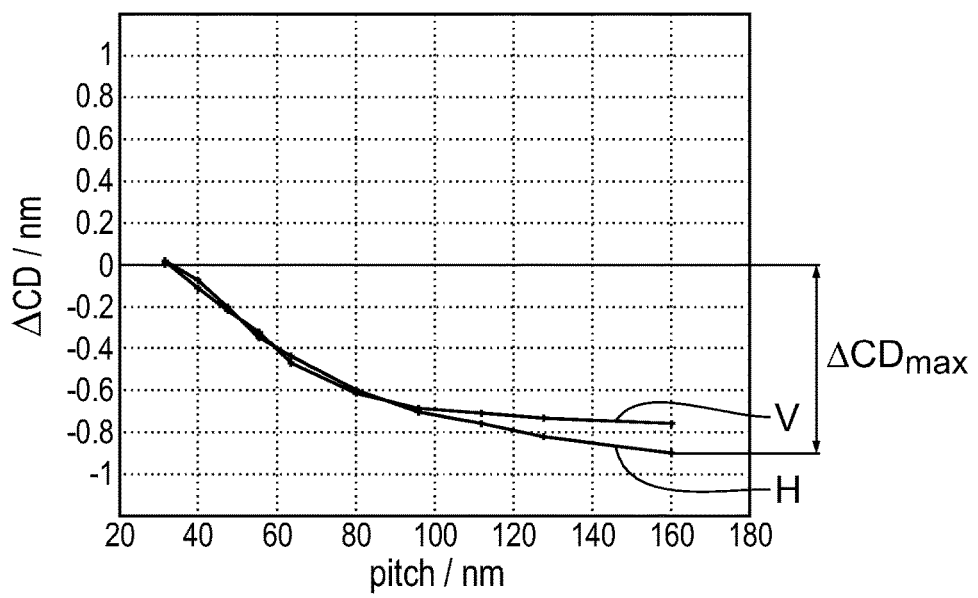
Figure 7:
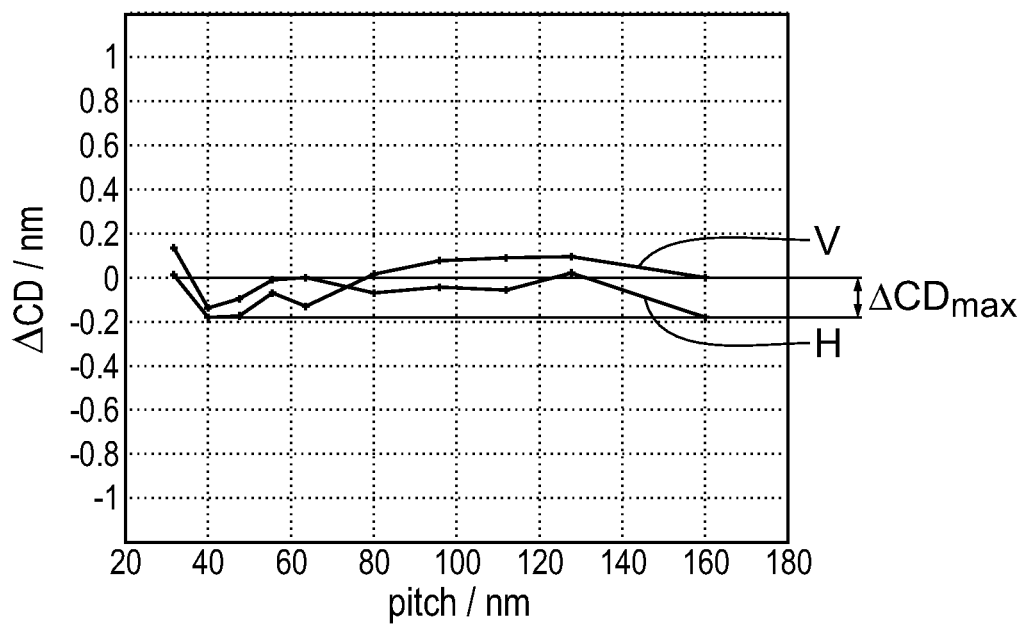
Figure 8:
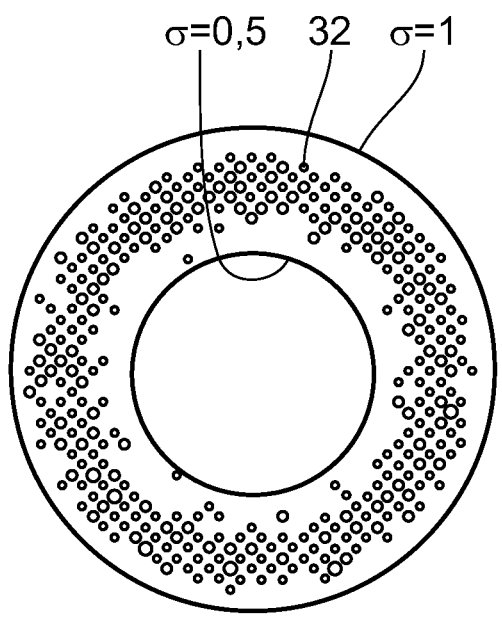
Figure 9:
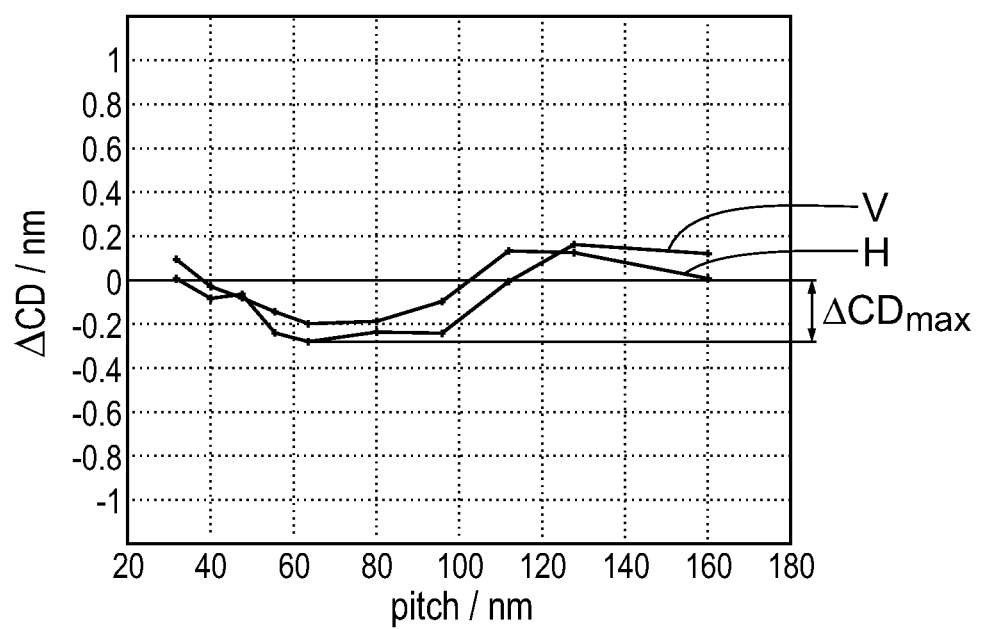
Figure 10C:
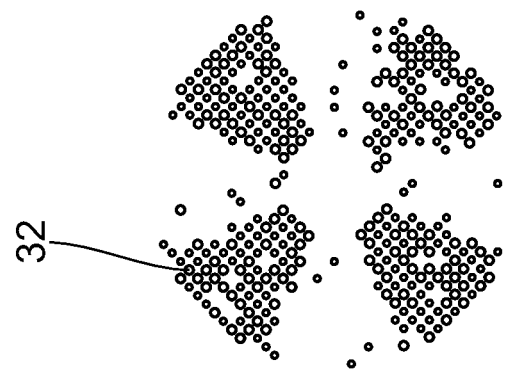
Figure 10B:
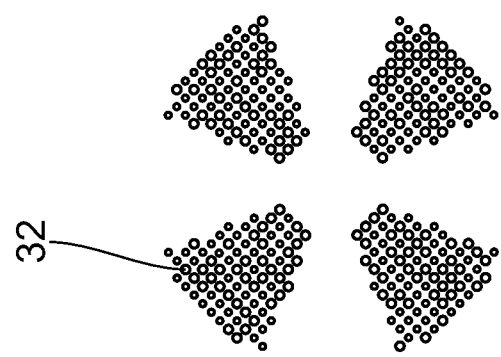
Figure 10A:
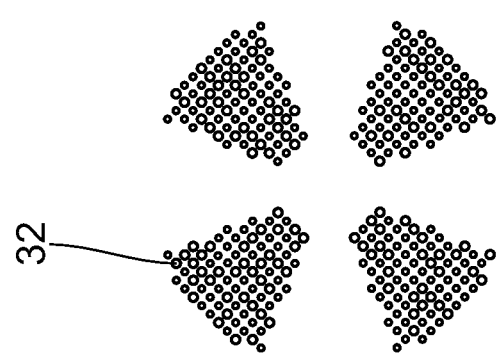
Figure 11:
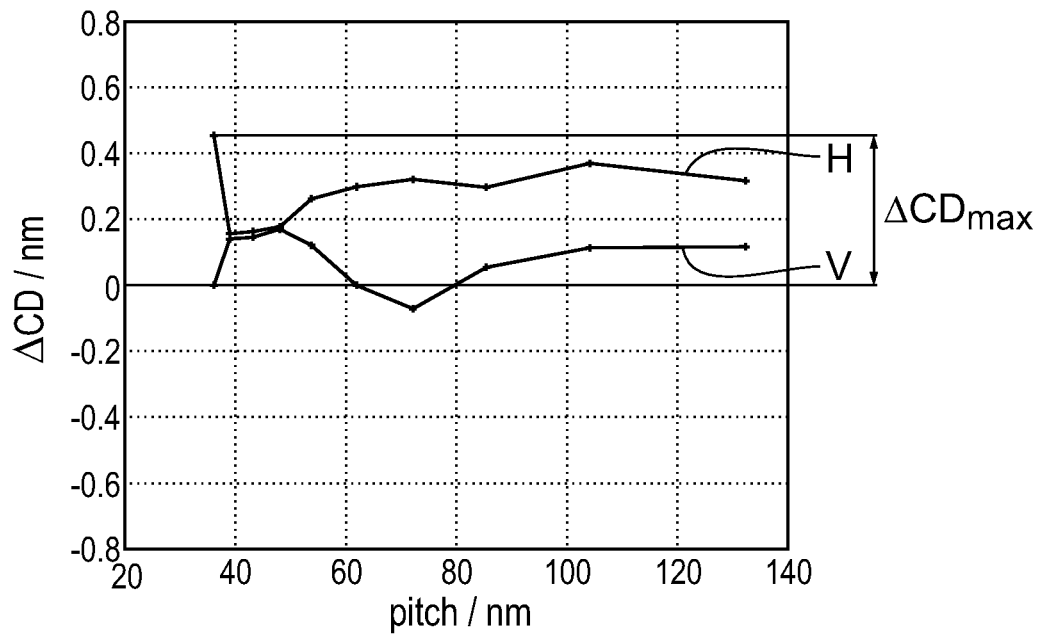
Figure 12:
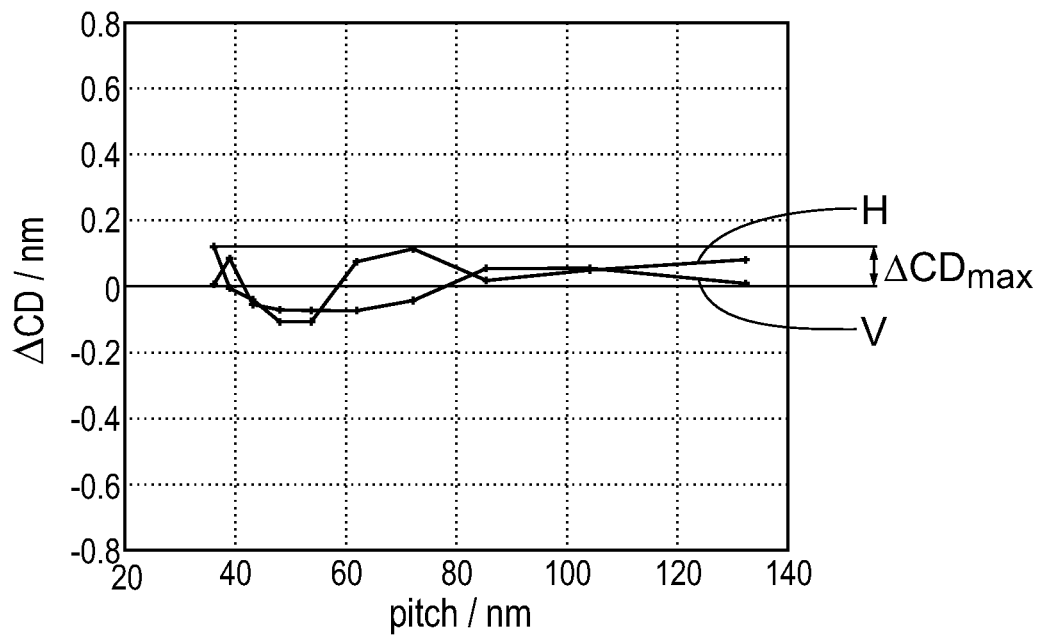
Figure 14:
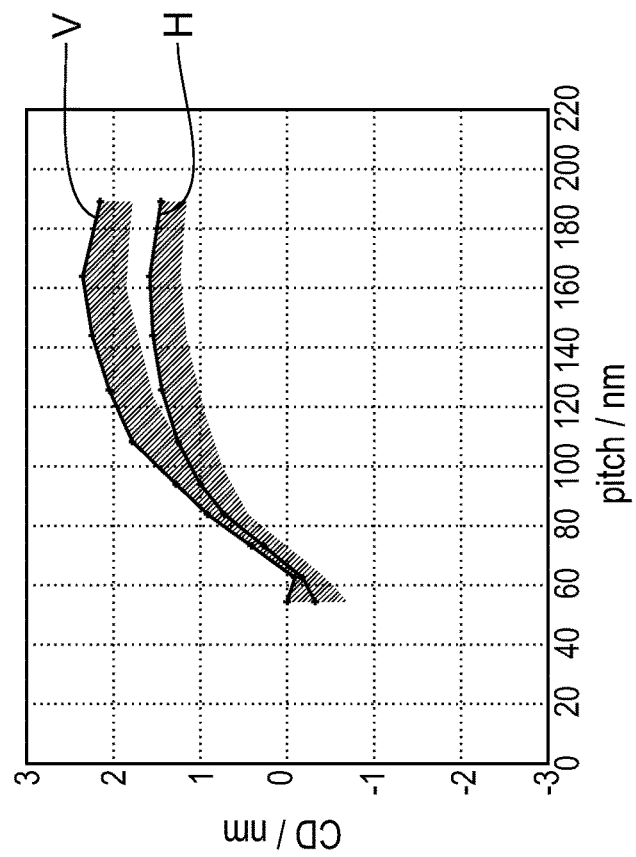
Figure 13:
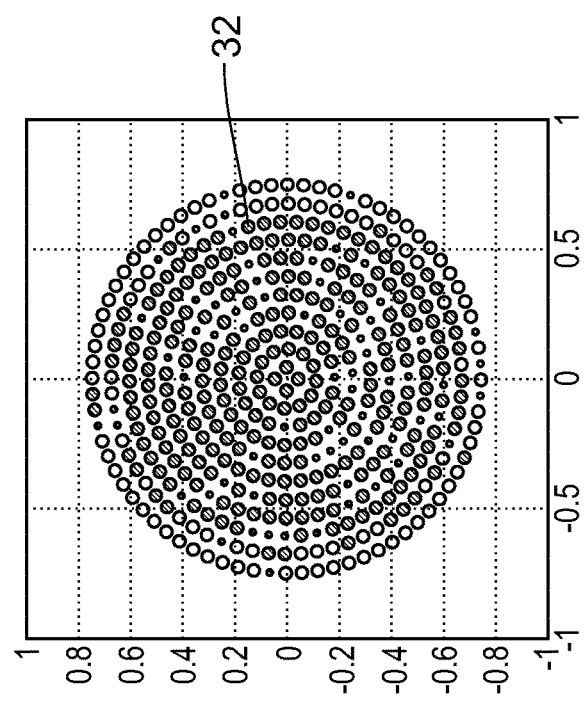
Figure 15:
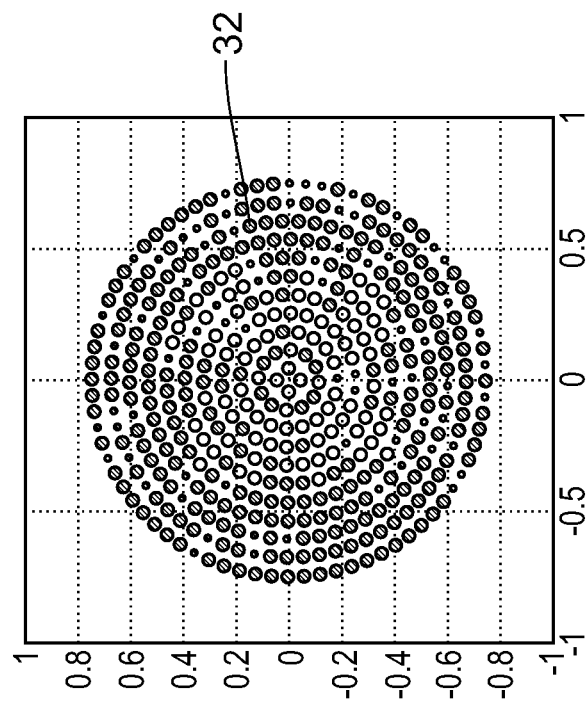
Figure 16:
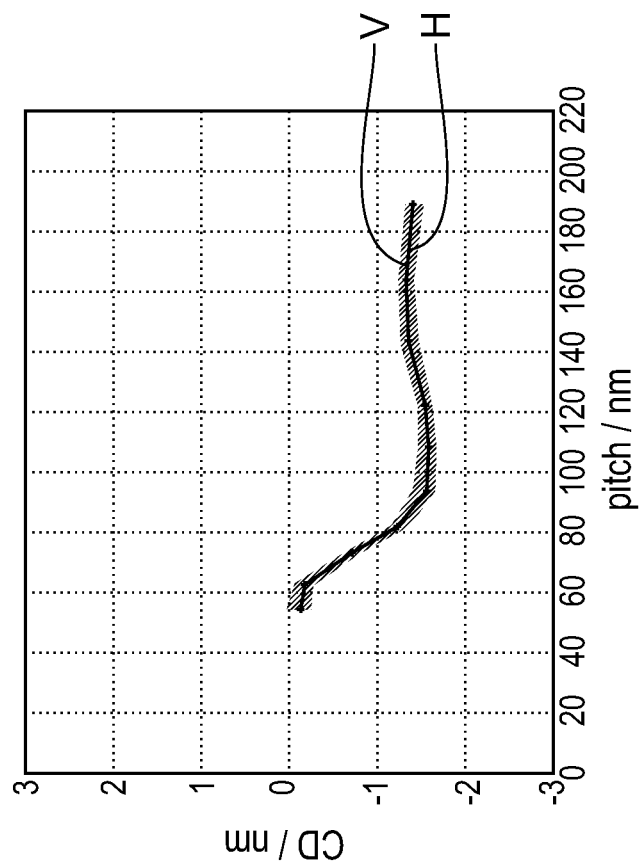
Figure 18:
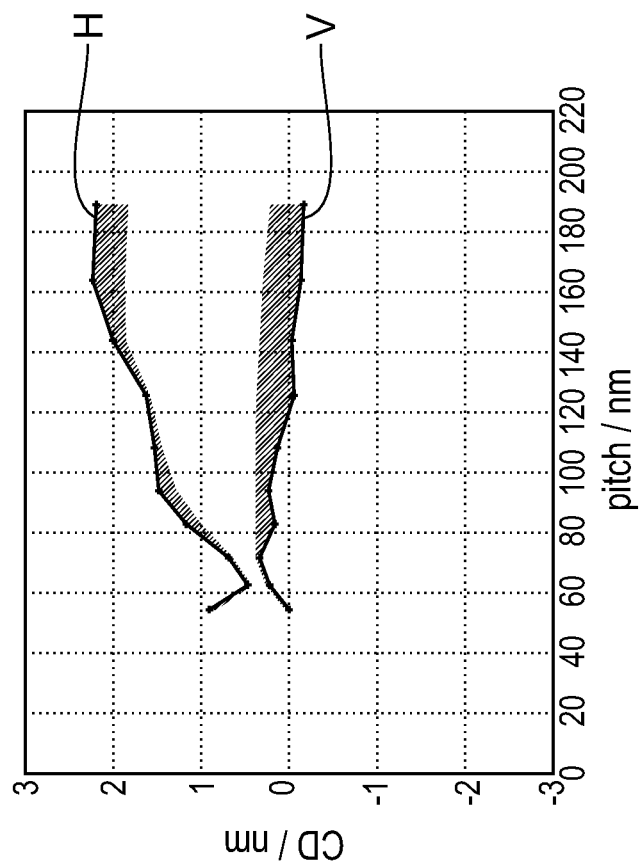
Figure 17:
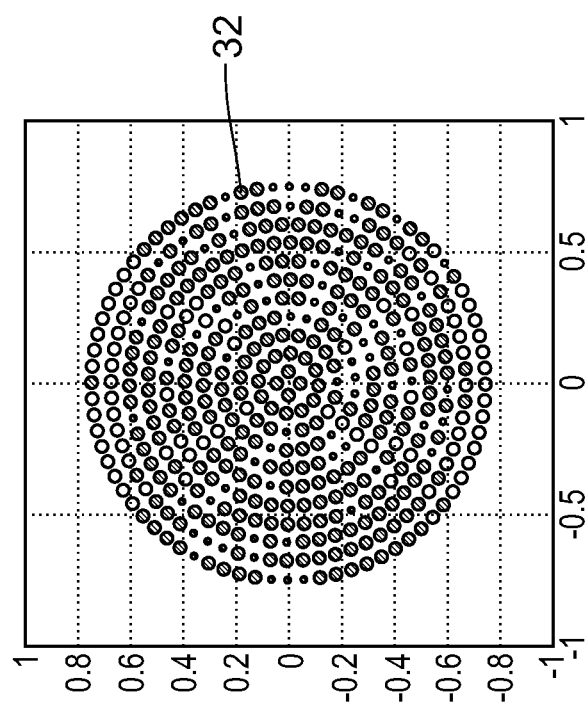
Figure 20:
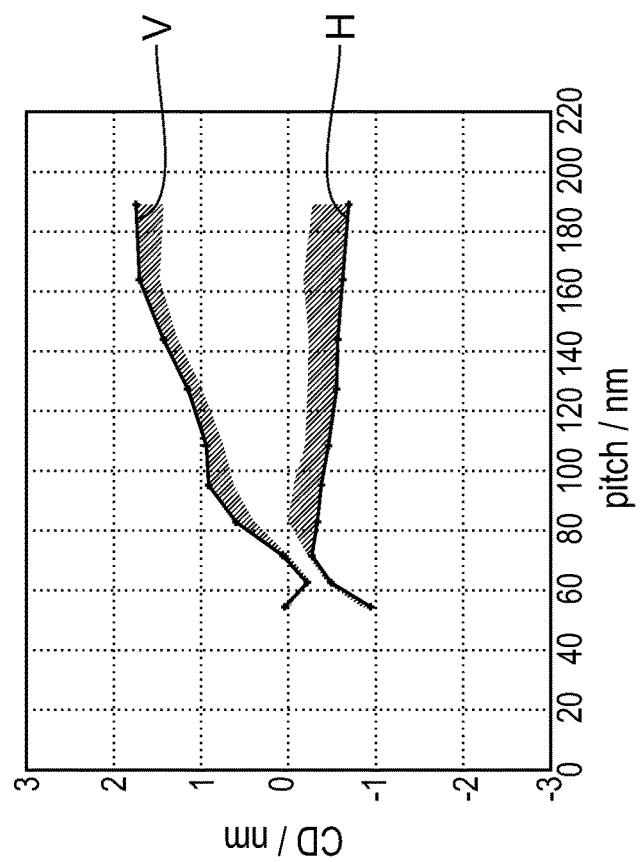
Figure 19:
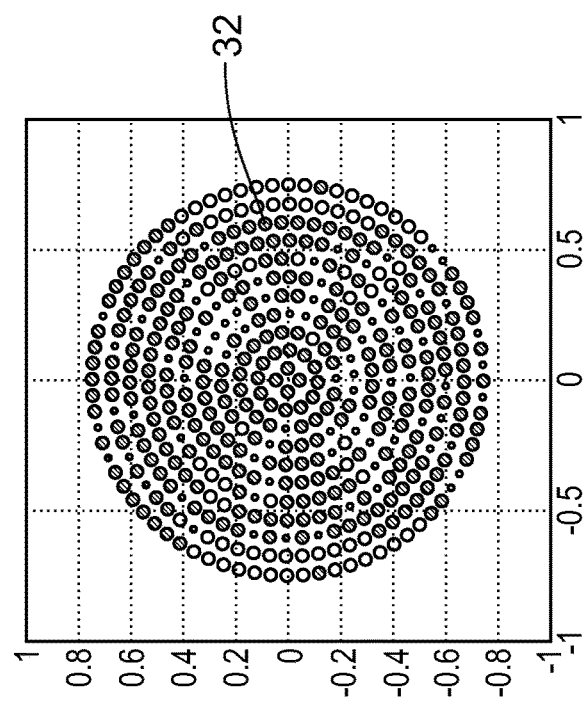

Further advantages, features and details of the invention emerge from the description of exemplary embodiments on the basis of the drawings. In detail:

FIG. 1 schematically shows a meridional section through a projection exposure apparatus for EUV projection microlithography, FIG. 2 shows a schematic illustration of a plurality of test structures to be imaged with horizontal and vertical lines and a different pitch, FIG. 3 shows an exemplary illustration of an annular illumination pupil, FIG. 4 schematically shows a flowchart for elucidating the individual method steps for setting the illumination setting, FIG. 5a shows an exemplary illustration of the annular illumination pupil of an initial illumination setting, FIG. 5b shows an exemplary illustration of a corresponding illumination pupil after varying the illumination setting, FIG. 6 shows, in an exemplary manner, the variation of a critical dimension (ΔCD) as a function of the pitch of the structures to be imaged when using the initial illumination setting, FIG. 7 shows a schematic illustration in accordance with FIG. 6 using a varied illumination setting with an illumination pupil in accordance with FIG. 5b, FIG. 8 shows an illustration in accordance with FIG. 5b, wherein the illumination setting was varied using the boundary condition according to which no spot of the illumination setting may lie within a region with σ=0.5, FIG. 9 shows an illustration in accordance with FIG. 7 with an illumination setting with the illumination pupil in accordance with FIG. 8, FIG. 10a shows an illumination pupil of a reference illumination system comprising a first EUV source, FIG. 10b shows a corresponding illumination pupil after interchanging the EUV source, FIG. 10c shows a schematic illustration of an optimized illumination pupil when proceeding from the illumination pupil in accordance with FIG. 10b, FIG. 11 shows an illustration of the variation of the critical dimension (ΔCD) as a function of the pitch of the structures to be imaged when using the illumination setting in accordance with FIG. 10b, FIG. 12 shows an illustration in accordance with FIG. 11 when using the illumination setting in accordance with FIG. 10c, FIG. 13 shows an illumination pupil for setting a positive iso-dense bias, FIG. 14 shows a plot of the critical dimension (CD) against the pitch when using the illumination setting in accordance with FIG. 13, FIG. 15 and FIG. 16 show illustrations in accordance with FIGS. 13 and 14 when setting a negative iso-dense bias, FIG. 17 shows an illumination pupil for setting a positive H–V offset, FIG. 18 shows a schematic plot of the critical dimension (CD) against the pitch when using an illumination setting in accordance with FIG. 17, and FIG. 19 and FIG. 20 show illustrations in accordance with FIGS. 17 and 18 for an illumination setting for setting a negative H–V offset.

First of all, the essential components and the basic design of a projection exposure apparatus 1 are described with reference to FIG. 1. In addition to a light or radiation source 3, an illumination system 2 of the projection exposure apparatus 1 includes an illumination optical unit 4 for exposing an object field 5 in an object plane 6. Here, a reticle which is arranged in the object field 5 and not depicted in the drawing is exposed. A projection optical unit 7 serves for imaging the object field 5 in an image field 8 in an image plane 9. A structure on the reticle is exposed on a light-sensitive layer of a wafer (likewise not depicted in the drawing) arranged in the region of the image field 8 in the image plane 9.

The radiation source 3 is an EUV radiation source with an emitted used radiation in the range between 5 nm and 30 nm. In particular, it may be a plasma source, for example a DPP (discharge produced plasma) source or an LPP (laser produced plasma) source. EUV radiation 10 emerging from the radiation source 3 is focussed by a collector 11. An appropriate collector is known from EP 1 225 481 A. Downstream of the collector 11, the EUV radiation 10 propagates through an intermediate focus plane 12 before it is incident on a field facet mirror 13 comprising a multiplicity of field facets 14.

In the following, the EUV radiation 10 is also referred to as illumination light or imaging light.

In order to simplify the illustration, a Cartesian xyz-coordinate system is plotted in FIG. 1. In FIG. 1, the x-direction extends perpendicular to the plane of the drawing and into the latter. The y-direction extends to the left in FIG. 1. The y-direction forms the scanning direction of the reticle or of the wafer. In FIG. 1, the z-direction extends upwards.

The projection exposure apparatus 1 is a scanner-type apparatus. This means that both the reticle in the object plane 6 and the wafer in the image plane 9 are moved continuously in the y-direction when the projection exposure apparatus 1 is in operation.

The field facets 14 can be arranged in facet groups in a column-by-column and line-by-line manner. For further details, reference is made to e.g. DE 10 2009 045 491 A1.

The field facets 14 can also be embodied as a microelectromechanical system (MEMS). In this case, they comprise a multiplicity of micromirrors, in particular displaceable micromirrors. For further details, reference is made to WO 2009/100 856 A1.

The EUV radiation 10 reflected by the field facet mirror 13 is made up of a multiplicity of radiation partial beams, wherein each partial beam is reflected by a specific field facet 14. Each partial beam is incident on a pupil facet mirror 17 at a pupil facet 16 assigned to a field facet 14. The radiation beam reflected by a specific field facet 14 onto an assigned pupil facet 16 forms a so-called illumination channel in each case.

The pupil facets 16 may be round. They are preferably arranged tightly packed on the pupil facet mirror 17.

The pupil facet mirror 17 is arranged in a plane of the illumination optical unit 4 coinciding with a pupil plane of the projection optical unit 7 or being optically conjugate thereto. Therefore, the intensity distribution of the EUV radiation 10 on the pupil facet mirror 17 is directly correlated to an illumination angle distribution of the illumination of the object field 5 in the object plane 6. The intensity distribution of the EUV radiation 10 on the pupil facet mirror 17 is also referred to as illumination pupil. The totality of all radiation channels is also referred to as illumination setting.

The field facets 14 of the field facet mirror 13 are imaged in the object plane 6 with the aid of the pupil facet mirror 17 and an imaging optical assembly in the form of a transmission optical unit 19. The transmission optical unit 19 includes three reflecting mirrors 20, 21 and 22 disposed downstream of the pupil facet mirror 17. Depending on the design of the projection optical unit 7 disposed downstream thereof, it is also possible to dispense with individual ones or all of the mirrors of the transmission optical unit 19.

The field facets 14 may have a shape which corresponds to the shape of the object field 5 to be illuminated. By way of example, such field facets are known from U.S. Pat. No. 6,452,661 and U.S. Pat. No. 6,195,201. To the extent that e.g. the last mirror 22 in front of the object field 5 ensures field shaping, the shape of the field facets 14 can also differ from the shape of the object field 5 to be illuminated. In particular, the field facets 14 can have a rectangular or bent embodiment.

A stop device 23 comprising a plurality of correction stops 24 which are housed in a changeable holder 25 schematically depicted in FIG. 1 is arranged adjacent to the reflecting surface of the pupil facet mirror 17. Respectively one selected correction stop 24, denoted by 24' in FIG. 1, can be arranged adjacent to the pupil facet mirror 17 in a beam path of the illumination light 10 via the changeable holder 25. The EUV radiation 10 passing through the illumination optical unit 4 must pass through the correction stop 24'. In the beam path of the EUV radiation 10 in accordance with FIG. 1, the EUV radiation 10 passes through the correction stop 24' twice. It is also possible for a plurality of the correction stops 24, which then interact, to be arranged in the beam path of the illumination light 10.

It is also possible to introduce a correction filter into the beam path of the EUV radiation 10 in place of a correction stop 24. It is possible to attenuate the transmission, in particular the intensity of the EUV radiation 10, via a filter. In particular, it is possible to regulate the transmission of individual illumination channels in a targeted manner.

For further details relating to the correction stops 24, reference is made to DE 10 2009 045 491 A1.

Moreover, a field intensity correction device 27 can be arranged in a correction plane 26 adjacent to the object field 5. The correction device 27 is also referred to as a UNICOM. It serves for setting a scan-integrated intensity distribution, i.e. an intensity distribution integrated in the y-direction, over the object field 5. The correction device 27 is actuated via a control device 28. For further details relating to the correction device 27, reference is made to DE 10 2011 005 881 A1, in particular to paragraph [0040] and the documents cited therein. In accordance with the stop device 23, the correction device 27 may include different stop elements and/or filter elements.

Moreover, the projection exposure apparatus 1 comprises a control device 15, via which the variation of the illumination setting is controllable. The control device 15 is connected to the stop device 23 and/or the control device 28 of the field intensity correction device 27 and/or to a control device (not depicted in the figures) for controlling the displacement of the displaceable facets 14 of the field facet mirror 13 in a signal-transferring manner.

For the purposes of setting an illumination setting, in particular an illumination pupil, it is possible, via the control device 15, for individual radiation channels to be attenuated via a filter element, to be stopped down, i.e. extinguished, via a stop element or to be switched over or switched off by swivelling the field facets 14. Combinations of these options are likewise possible. Moreover, use can be made of the field intensity correction device 27. It modifies not only the pupil-integrated intensity as a function of a field point, but also the details of the pupil shape.

FIG. 2 shows, in an exemplary manner, line structures 29 with horizontal (H) lines 30 or vertical (V) lines 31. In the structures 29 depicted in FIG. 2, all lines 30, 31 have a uniform line width b. However, they differ in terms of a line spacing 1, which is also referred to as pitch. Apart from a reduction factor of the projection optical unit 7, the structures of the mask to be imaged, depicted in FIG. 2, correspond to the target structures on the wafer. However, the line width on the mask may deviate from the target line width on the wafer (this is the so-called proximity effect or OPC ("optical proximity correction")). Here, the line width generated on the wafer is also referred to as critical line width or critical dimension (CD). Variations in the critical dimension (ΔCD) form a measure of the optical quality of the projection exposure apparatus 1.

FIG. 3 depicts, in an exemplary manner, an annular illumination pupil. The illumination pupil corresponds precisely to the intensity distribution of the EUV radiation 10 on the pupil facets 16 of the pupil facet mirror 17. In FIG. 3, each spot 32 corresponds to a pupil facet 16 impinged upon by EUV radiation 10. Here, the spot radius corresponds to the intensity of the EUV radiation 10 at this location of the illumination pupil.

Moreover, FIG. 3 elucidates an outer boundary 33 and an inner boundary 34 of the illumination pupil. The illumination pupil is conventionally described using a cylindrical pupil coordinate system. Here, such a normalized coordinate is used for a radius a of the illumination pupil that the following applies at the pupil edge, i.e. at the numerical aperture of the illumination system 2: σ=1. In FIG. 3, the outer boundary 33 corresponds to the value σ=1, while the inner boundary 34 corresponds to the value σ=0.5.

In the following text, a method according to the invention for setting an illumination setting is described. The illumination system 2 comprising the illumination optical unit 4 and the radiation source 3 is provided for initialization purposes 35. Thereupon, a start or initial illumination setting with an initial transmission and an initial illumination pupil is generated in a first step 36.

Moreover, an imaging variable to be set is predetermined. In particular, this is an imaging variable in the region of the image field 8. By way of example, this may be a variation of the critical dimension due to field variations, projection aberrations or system variations. It may also be the difference in the critical dimension of horizontal (H) and vertical (V) structures 29 (H–V difference). It may also be the difference in the critical dimensions of isolated and dense structures 29 (iso-dense bias). It may also be a dependency of the critical dimension on the pitch (the so-called throughpitch characteristic). It may also be a value for characterizing the imaging telecentricity.

Moreover, a target value and, optionally, a tolerance range is predetermined for the at least one imaging variable to be set.

Thereupon, an actual value for the at least one imaging variable is determined in a determination step 37. To this end, it is possible, either, to image a predetermined test structure 29 with horizontal and/or vertical lines 30, 31 on a wafer and measure the corresponding imaging variable, or to make use of a simulation method.

Thereupon, a deviation of the determined actual values from the target value is calculated in a calculation step 38. To this end, use is made of a suitable merit function. The following will specify a few examples of merit functions:

By way of example, the merit function can be given by the maximum value of |ΔCD| over all pitches and field points, i.e. the deviation from the intended profile of the CD curve. As an alternative to this, the merit function can be given by the maximum value of |H–V difference| over all pitches and field points. It can also be given by the root mean square (RMS) of ΔCD over all pitches and field points or by the root mean square (RMS) of |H–V difference| over all pitches and field points. It can also be given as the maximum value of the magnitude of the imaging telecentricity (TC) over all pitches and field points or over the root mean square of same. It can also comprise any desired combinations, in particular linear combinations, of these values.

Target values for the maximum value of |ΔCD| or the maximum value of |H–V difference| can be the following: at most 1.0 nm, in particular at most 0.5 nm, in particular at most 0.3 nm, in particular at most 0.1 nm. Target values for the imaging telecentricity can be the following: at most 5 mrad, in particular at most 2 mrad, in particular at most 1 mrad.

Boundary conditions in particular can be taken into account in the merit function. In particular, provision can be made for predetermining boundary conditions that must be satisfied when setting the illumination setting. By way of example, a possible boundary condition is that the illumination setting to be set has a minimum transmission value. The latter can lie at at least 90%, in particular at least 95%, in particular at least 99% of the initial transmission.

A further boundary condition can consist of at most 10%, in particular at most 5%, in particular at most 1% of the illumination channels of the initial illumination setting being varied. A further boundary condition can consist of the illumination setting to be set having an illumination pupil in which at most 5%, in particular at most 1%, in particular none of the illumination channels lie outside of the outer boundary 33 or within the inner boundary 34 of the initial illumination pupil by more than a predetermined maximum value. By way of example, the maximum deviation relative to the radius a, normalized to 1, of the initial illumination pupil can be predetermined to be $0.2\sigma$, $0.1\sigma$ or $0.05\sigma$.

A minimum value for the imaging telecentricity can also be predetermined as a boundary condition. For further alternatives and details, reference is made to WO 2011/076 500 A1.

After calculating the merit function in the calculation step 38, a check is carried out in a checking step 39 as to whether the merit function satisfies a predetermined criterion. The predetermined criterion may consist of the merit function assuming a value which is smaller than an absolute target value. Here, a predetermined tolerance range can be considered where applicable. The criterion can also consist of the merit function assuming a value which is smaller than the value during the previous iteration by a minimum value or a relative portion. If the criterion is satisfied, the algorithm for setting the illumination setting can be terminated; the end 40 of the method for setting the illumination setting has been reached.

To the extent that the criterion has not been satisfied, the illumination setting, in particular the illumination pupil, is varied in a variation step 41. To this end, individual illumination channels are, in particular, switched off or switched over. Thereupon, the actual value of the imaging variable of the new, i.e. varied, illumination pupil is established in a further determination step 42. This is performed like in the determination step 37.

The loop made up of variation step 41 for varying the illumination setting, in particular the illumination pupil, of the determination step for establishing the actual value of the at least one imaging variable to be set, of the calculation step 38 for calculating the merit function, in particular the deviation of the actual value of the imaging variable from the target value and of the checking step 39 for checking the value of the merit function can be run through a number of times. In other words, an iterative method is provided for varying the illumination setting. In particular, this is a so-called discrete optimization method.

By way of example, for the purposes of optimizing the illumination setting, it is possible initially to make a preselection of the illumination setting via a simulation method and thereupon to test this after selecting a specific number of illumination settings and to measure the actually resulting imaging variable on the wafer.

By way of example, for the purposes of optimizing the illumination setting, it is also possible, in succession and for test purposes, to switch off each illumination channel or switch it over by tilting the corresponding field facet 14. Here, the switching off or switching over can be maintained if it improves the value of the merit function. As soon as all illumination channels have been passed through, the method is started from the beginning again.

It is also possible to apply a global optimization method, e.g. a genetic algorithm, or so-called simulated annealing. Here, a subset of the illumination channels can be switched off or switched over. In the so-called global method, the merit function is occasionally worsened in order thereby to avoid being caught in a local minimum.

Like actual imaging of a test structure and measuring of the structures generated in the image field and a simulation method are possible for determining the actual value of the imaging variable to be set, actual influencing of the illumination setting, in particular via a correction device and/or by repositioning a number of field facets 14 and thus switching individual illumination channels over or off or by varying the illumination setting with the aid of a prediction model (pupil predictor), is possible for setting a varying illumination setting.

Below, the advantages of the setting according to the invention of the illumination setting are explained on the basis of few exemplary examples on the basis of the figures.

FIG. 5a depicts a start or initial illumination pupil of an initial illumination setting. As described above, the individual spots 32 reproduce the intensity of the illumination radiation 10 on the pupil facet mirror 17. This is an annular illumination setting.

FIG. 6 depicts the deviation of the critical dimension ($\Delta$CD) as a function of the pitch when using the illumination setting in accordance with FIG. 5a for line structures 29 with horizontal lines H or vertical lines V. In this figure and in the corresponding subsequent figures, the curves represent values which are respectively averaged over the field points. The line structures 29 have a line width b which leads to a critical dimension of 16 nm on the wafer. The maximum absolute deviation of the critical dimension ($\Delta CD_{max}$) averaged over the field points of the image field is 0.89 nm.

The start illumination settings depicted in the figures are to be understood to be exemplary. Any illumination setting which, for whatever reasons was selected for an application, may serve as start setting.

A variation of the illumination setting in accordance with FIG. 5a led to the intensity distribution on the pupil facet mirror 17 depicted in FIG. 5b. As is possible to gather from FIG. 5b, some illumination channels were switched over, and so the varied illumination setting in accordance with FIG. 5b is no longer a precisely annular illumination setting.

Using the illumination setting in accordance with FIG. 5b, the maximum deviation of the critical dimension ($\Delta CD_{max}$) averaged over the field points was reduced to 0.19 nm, as depicted in FIG. 7.

FIG. 8 depicts an illumination pupil in accordance with the one shown in FIG. 5b, with a predetermined boundary condition being that the shape of the initial illumination setting, i.e. the annulus, is modified as little as possible.

In particular, as a boundary condition, it is possible to predetermine that the spots 32 lie outside of the region of the $\sigma$ values of the initial illumination setting by a $\sigma$ value of at most 0.02, in particular at most 0.01, in particular at most 0.005 or that these do not lie at all outside of the region of the $\sigma$ values.

What was predetermined, in particular, was that all spots 32 lie within the ring field which is delimited by the circles with $\sigma$=0.5 and $\sigma$=1.

The profile of the deviation of the critical dimension as a function of the pitch obtained by this illumination setting is depicted in FIG. 9. The maximum deviation of the critical dimension ($\Delta CD_{max}$) averaged over the field points was 0.29 nm.

A further source of deviations in the critical dimension may be that the reticle to be imaged is used with different projection exposure apparatuses 1. These deviations can also be traced back to a replacement of the radiation source 3. Replacing the radiation source 3 leads to a change in the intensity distribution in the far field. This leads to a change in the intensity distribution of the pupil spots 32 and therefore to a deviation of the profile of the critical dimension against the pitch (the so-called CD through pitch behaviour).

FIG. 10a depicts the illumination pupil of a first illumination system 2. This is a so-called quasar illumination. The critical dimension to be obtained on the wafer was 18 nm.

FIG. 10b correspondingly shows the illumination pupil after replacing the radiation source 3 or when a different illumination system 2, the settings of which otherwise correspond to those of the reference system, is used. It is possible to identify qualitatively that the replacement of the radiation source 3 or the use of a second illumination system 2 leads to a modified intensity distribution of the illumination pupil. The corresponding influence on the deviation of the critical dimension is depicted in FIG. 11. The maximum deviation of the critical dimension ($\Delta CD_{max}$) was 0.48 nm.

FIG. 10c depicts an illumination pupil adapted in accordance with the method. As can be identified qualitatively, individual illumination channels were once again switched over or switched off. The associated $\Delta CD$ through pitch profile is depicted in FIG. 12. The maximum deviation of the critical dimension ($\Delta CD_{max}$) was 0.16 nm.

FIG. 13 depicts an illumination pupil in which, proceeding from conventional illumination, in which the whole circle surface is filled, i.e. illuminated, within a maximum radius, the illumination setting was varied with all pupil facet mirrors 17 in order to generate a positive change in the so-called iso-dense bias, i.e. a modification of the mean offset of the critical dimension between line structures 29 with isolated lines 30, 31, i.e. lines with a large pitch 1, and dense lines 30, 31. In the varied illumination setting in accordance with FIG. 13, one hundred and one illumination channels of a total of more than four hundred illumination channels were switched off. The resulting CD through pitch profile is depicted in FIG. 14. Here, the solid curve reproduces the value of the central field point (x=0). The variation over 13 different field points is elucidated by shading. The critical dimension was 27 nm.

FIGS. 15 and 16 reproduce a corresponding result for setting a negative change in the iso-dense bias.

Accordingly, FIGS. 17 to 20 elucidate the setting of a positive or negative H–V offset by switching off illumination channels.

As becomes clear from all examples, a significant improvement in the relevant imaging variables on the wafer is made possible via the method according to the invention for setting the illumination setting.

In order to produce a microstructured or nanostructured component, the projection exposure apparatus 1 is used as follows: initially, the reticle and the wafer are provided. Subsequently, an illumination setting is set in accordance with the above-described method. Thereupon a structure on the reticle is projected onto a light-sensitive layer of the wafer with the aid of the projection exposure apparatus 1. Then, a microstructure is generated on the wafer by developing the light-sensitive layer, and hence the microstructured or nanostructured component is generated.

The invention claimed is:
1. A method, comprising:
providing an illumination optical unit configured to form an illumination setting for illuminating a reticle arranged in an object field and providing a projection optical unit configured to image the object field into an image field, the illumination optical unit comprising:
a first facet mirror comprising a multiplicity of individual mirrors;
a second facet mirror comprising a multiplicity of individual mirrors, the second facet mirror being downstream of the first facet mirror in a beam path of the illumination optical unit, a subset of the individual mirrors of the first facet mirror being uniquely assignable to a subset of the individual mirrors of the second facet mirror to form illumination channels of the illumination setting; and
a mechanism configured to vary the illumination setting, the mechanism comprising a correction device which comprises a multiplicity of adjustable correction elements to influence the transmission;
determining an initial illumination setting comprising an initial transmission and an initial illumination pupil;
determining an imaging variable for a region of the image field;
determining a target value for the imaging variable;
determining an actual value for the imaging variable; and
varying the illumination setting until the actual value corresponds to the target value within predetermined tolerances.

2. The method of claim 1, comprising adjusting at least one of the correction elements of the correction device to vary the illumination setting.

3. The method of claim 1, comprising adjusting at least one of the individual mirrors of the first facet mirror to vary the illumination setting.

4. The method of claim 1, comprising imaging a test structure in the object field into the image field to determine the actual value.

5. The method of claim 1, comprising using a simulation method to determine the actual value.

6. The method of claim 1, wherein the imaging variable comprises a variables selected from the group consisting of a variation of a critical dimension due to a different pitch, a field variation, a projection aberration, a system variation, a difference in a critical dimension of horizontal and vertical structures, and a difference in a critical dimension of isolated and dense structures.

7. The method of claim 1, comprising predetermining a boundary condition which is satisfied during the variation of the illumination setting.

8. The method of claim 7, comprising predetermining a minimum transmission value of 90% of the initial transmission as a boundary condition for varying the illumination setting.

9. The method of claim 7, wherein the boundary condition is that at most 10% of the illumination channels are varied.

10. The method of claim 7, wherein the boundary condition is that the varied illumination setting has an illumination pupil in which at most 5% of the illumination channels lie at a distance of more than 20% of a radius, normalized to 1, of a boundary of the initial illumination pupil.

11. The method of claim 1, comprising using an iterative, discrete optimization method to vary the illumination setting.

12. The method of claim 1, further comprising using the illumination optical unit in a microlithography process to make a structured component.

13. The method of claim 1, wherein varying the illumination setting until the actual value corresponds to the target value within the predetermined tolerances comprises varying at least some of the multiplicity of adjustable correction elements to influence the transmission until the actual value corresponds to the target value within the predetermined tolerances.

14. The method of claim 13, comprising using at least some of the multiplicity of adjustable correction elements to uniquely assign the subset of the individual mirrors of the first facet mirror to the subset of the individual mirrors of the second facet mirror to form the illumination channels of the illumination setting.

15. The method of claim 1, wherein the imaging variable comprises an imaging telecentricity.

16. An illumination optical unit configured to illuminate an object field with an illumination setting, the illumination optical unit comprising:
- a first facet mirror comprising a multiplicity of individual mirrors;
- a second facet mirror comprising a multiplicity of individual mirrors, a subset of the individual mirrors of the first facet mirror being assignable to a subset of the individual mirrors of the second facet mirror to form illumination channels of the illumination setting, and
- a mechanism configured to vary the illumination setting, the mechanism comprising a device comprising a multiplicity of adjustable correction elements configured to influence the transmission; and
- a control device configured to control the mechanism, wherein:
- the multiplicity of adjustable correction elements comprises first elements upstream of the second facet mirror along the illumination channels;
- the first elements are selected from the group consisting of filters and stops;
- the first correction elements are configured to attenuate or stop down individual mirrors of the second facet mirror; and
- the multiplicity of adjustable correction elements further comprises a field intensity correction device in a plane adjacent to the object field.

17. An illumination system, comprising:
a radiation source; and
an illumination optical unit according to claim 16.

18. An apparatus, comprising:
an illumination optical unit according to claim 16; and
a projection optical unit,
wherein the apparatus is a projection exposure apparatus.

19. The apparatus of claim 18, further comprising a radiation source.

20. The illumination optical unit of claim 16, wherein the field intensity correction device comprises a UNICOM.

* * * * *